United States Patent
Feng et al.

(10) Patent No.: US 10,284,204 B2
(45) Date of Patent: May 7, 2019

(54) LOGIC UNIT CIRCUIT AND PIXEL DRIVING CIRCUIT

(71) Applicants: BOE Technology Group Co., Ltd., Beijing (CN); Hefei Xinsheng Optoelectronics Technology Co., Ltd., Hefei (CN)

(72) Inventors: Xuehuan Feng, Beijing (CN); Bo Mao, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 16/007,472

(22) Filed: Jun. 13, 2018

(65) Prior Publication Data

US 2019/0068196 A1 Feb. 28, 2019

(30) Foreign Application Priority Data

Aug. 25, 2017 (CN) .......................... 2017 1 0744415

(51) Int. Cl.
*H03K 19/21* (2006.01)
*H03K 3/037* (2006.01)
*G09G 3/20* (2006.01)

(52) U.S. Cl.
CPC ............ *H03K 19/215* (2013.01); *H03K 3/037* (2013.01); *G09G 3/20* (2013.01); *G09G 2300/0814* (2013.01)

(58) Field of Classification Search
None
See application file for complete search history.

(56) References Cited

U.S. PATENT DOCUMENTS

| | | | | |
|---|---|---|---|---|
| 4,694,274 A * | 9/1987 | Shimada | ............... | H03K 19/215 340/146.2 |
| 5,355,031 A * | 10/1994 | Fulkerson | .......... | H03K 19/0948 326/122 |
| 7,279,936 B2 * | 10/2007 | Gliese | ................ | H03K 19/1736 326/104 |
| 8,773,165 B2 * | 7/2014 | Nakamura | ........... | H03K 19/215 326/104 |

* cited by examiner

*Primary Examiner* — Minh D A
*Assistant Examiner* — James H Cho
(74) *Attorney, Agent, or Firm* — Banner & Witcoff, Ltd.

(57) ABSTRACT

There are provided a logic unit circuit and a pixel driving circuit, which relate to a display technical field and are used to solve the problem that technical difficulties are increased due to mixed use of different types of transistors in the logic unit circuit. The logic unit circuit includes a first transistor, a second transistor, a third transistor, a fourth transistor, a fifth transistor, a sixth transistor, a seventh transistor, an eighth transistor, a ninth transistor and a tenth transistor of a same type. The logic unit circuit is used to realize logic gate operation.

17 Claims, 5 Drawing Sheets

LOGIC UNIT CIRCUIT AND PIXEL DRIVING CIRCUIT

CROSS-REFERENCE TO RELATED APPLICATION

This application claims priority to and the benefit of Chinese Patent Application No. 201710744415.3 filed on Aug. 25, 2017, which application is incorporated herein in its entirety.

TECHNICAL FIELD

The present disclosure relates to a field of display technique, in particular to a logic unit circuit and a pixel driving circuit.

BACKGROUND

In the display field, an exclusive-OR gate circuit is always used as a common logic unit circuit in various driving circuits of the display panel. As for an exclusive-OR gate circuit having two inputs, when and only when signals from the two inputs are different, an output thereof is at a high voltage; otherwise, the output is at a low voltage.

SUMMARY

According to a first aspect of embodiments of the present disclosure, there is provided a logic unit circuit, comprising: a first transistor, a second transistor, a third transistor, a fourth transistor, a fifth transistor, a sixth transistor, a seventh transistor, an eighth transistor, a ninth transistor, a tenth transistor of a same type, wherein a gate of the first transistor, a gate of the second transistor, a gate of the third transistor, and a gate of the fourth transistor are connected to a first input terminal;

A first electrode of the first transistor is connected to a first voltage terminal, a second electrode thereof is connected to the gate of the ninth transistor; a first electrode of the second transistor is connected to the first voltage terminal, and a second electrode thereof is connected to a gate of the tenth transistor; a first electrode of the third transistor is connected to a gate of the ninth transistor, a second electrode thereof is connected to a second voltage terminal; a first electrode of the fourth transistor is connected to a first output terminal, and a second electrode thereof is connected to a first electrode of the seventh transistor;

A gate of the fifth transistor, a gate of the sixth transistor, a gate of the seventh transistor, and a gate of the eighth transistor are connected to a second input terminal; a first electrode of the fifth transistor is connected to the first voltage terminal, a second electrode thereof is connected to the gate of the ninth transistor; a first electrode of the sixth transistor is connected to the first voltage terminal, a second electrode thereof is connected to the gate of the tenth transistor; a second electrode of the seventh transistor is connected to the second voltage terminal; a first electrode of the eighth transistor is connected to the gate of the tenth transistor, and a second electrode thereof is connected to the second voltage terminal;

A first electrode of the ninth transistor is connected to the first voltage terminal, and a second electrode thereof is connected to the first output terminal; a first electrode of the tenth transistor is connected to the first voltage terminal, and a second electrode thereof is connected to the first output terminal.

Optionally, the logic unit circuit further comprises an eleventh transistor, whose gate and first electrode are connected to the first voltage terminal, and second electrode is connected to the first electrode of the first transistor and the first electrode of the fifth transistor.

Optionally, the logic unit circuit further comprises a twelfth transistor, whose gate and first electrode are connected to the first voltage terminal, and second electrode is connected to the first electrode of the second transistor and the first electrode of the sixth transistor.

Optionally, the logic unit circuit further comprises a first capacitor, whose one terminal is connected to the gate of the ninth transistor, and another terminal is connected to the first output terminal.

Optionally, the logic unit circuit further comprises a second capacitor, whose one terminal is connected to the gate of the tenth transistor, and another terminal is connected to the first output terminal.

Optionally, the logic unit circuit further comprises a thirteenth transistor, a fourteenth transistor, a fifteenth transistor. A gate of the thirteenth transistor is connected to the second electrode of the first transistor, the second electrode of the second transistor, the second electrode of the fifth transistor, and the second electrode of the sixth transistor, a first electrode thereof is connected to a second electrode of the fourteenth transistor and a gate of the fifteenth transistor, and a second electrode thereof is connected to the second voltage terminal; a gate and a first electrode of the fourteenth transistor are connected to the first voltage terminal; a first electrode of the fifteenth transistor is connected to the first output terminal, and a second electrode thereof is connected to the second voltage terminal.

Optionally, the logic unit circuit further comprises a sixteenth transistor and a seventeenth transistor. A gate and a first electrode of the sixteenth transistor are connected to the first voltage terminal, and a second electrode thereof is connected to the second output terminal; a gate of the seventeenth transistor is connected to the first output terminal, a first electrode thereof is connected to the second output terminal, and a second electrode thereof is connected to the second voltage terminal.

According to a second aspect of embodiments of the present disclosure, there is provided a method for driving the logic unit circuit as described above. Transistors in the logic unit circuit are N type transistors. The method comprises: inputting a first voltage to a first voltage terminal, inputting a second voltage to a second voltage terminal, inputting a first signal to a first input terminal, and inputting a second signal to a second input terminal, so that the first output terminal outputs a signal which is obtained after exclusive-OR is performed on the first signal and the second signal; wherein the first voltage is greater than the second voltage.

According to a third aspect of embodiments of the present disclosure, there is provided a method for driving the logic unit circuit as described above. Transistors in the logic unit circuit are P type transistors. The method comprises: inputting a third voltage to a first voltage terminal, inputting a fourth voltage to a second voltage terminal, inputting a first signal to a first input terminal, and inputting a second signal to a second input terminal, so that the first output terminal outputs a signal which is obtained after exclusive-NOR is performed on the first signal and second signal; wherein the fourth voltage is greater than the third voltage.

According to a fourth aspect of embodiments of the present disclosure, there is provided a pixel driving circuit, comprising the logic unit circuit as described above.

The embodiments of the present disclosure provide a logic unit circuit and a pixel driving circuit. The logic unit circuit comprises ten transistors of the same type, wherein the gate of the first transistor, the gate of the second transistor, the gate of the third transistor, and the gate of the fourth transistor are connected to the first input terminal. The first electrode of the first transistor is connected to the first voltage terminal, the second electrode thereof is connected to the gate of the ninth transistor; the first electrode of the second transistor is connected to the first voltage terminal, the second electrode thereof is connected to the gate of the tenth transistor; the first electrode of the third transistor is connected to the gate of the ninth transistor, the second electrode thereof is connected to the second voltage terminal; the firs electrode of the fourth transistor is connected to the first output terminal, and the second electrode thereof is connected to the first electrode of the seventh transistor.

The gate of the fifth transistor, the gate of the sixth transistor, the gate of the seventh transistor, and the gate of the eighth transistor are connected to the second input terminal; the first electrode of the fifth transistor is connected to the first voltage terminal, the second electrode thereof is connected to the gate of the ninth transistor; the first electrode of the sixth transistor is connected to the first voltage terminal, and the second electrode thereof is connected to the gate of the tenth transistor; the second electrode of the seventh transistor is connected to the second voltage terminal; the first electrode of the eighth transistor is connected to the gate of the tenth transistor, and the second electrode thereof is connected to the second voltage terminal.

The first electrode of the ninth transistor is connected to the first voltage terminal, the second electrode thereof is connected to the first output terminal; the first electrode of the tenth transistor is connected to the first voltage terminal, and the second electrode thereof is connected to the first output terminal.

BRIEF DESCRIPTION OF THE DRAWINGS

In order to describe the technical solutions in embodiments of the present disclosure or in the prior art more clearly, Figures needed to be used in the embodiments or in the prior art will be introduced below briefly. Obviously, the figures described below are just some embodiments of the present disclosure, for those ordinary skilled in the art, other figures can be obtained from these figures without paying any inventive labor.

DETAILED DESCRIPTION

As the inventor noticed, in the prior art, the exclusive-OR gate circuit is a circuit where P type transistors and N type transistors are used in a mixed manner. Since manufacturing processes of different types of transistors are different such that technical difficulties are increased, the existing exclusive-OR gate circuit has evident disadvantages in the technique and cost. In other words, technical difficulties are increased due to mixed use of different types of transistors in the existing logic unit circuit.

Technical solutions in embodiments of the present disclosure will be described below clearly and completely by combining with figures in embodiments of the present disclosure. Obviously, the embodiments described below are just a part of embodiments of the present disclosure, but not all the embodiments. Based on the embodiments in the present disclosure, all the other embodiments obtained by those skilled in the art without paying any inventive labor belong to the scope sought for protection in the present disclosure.

Figure 1:
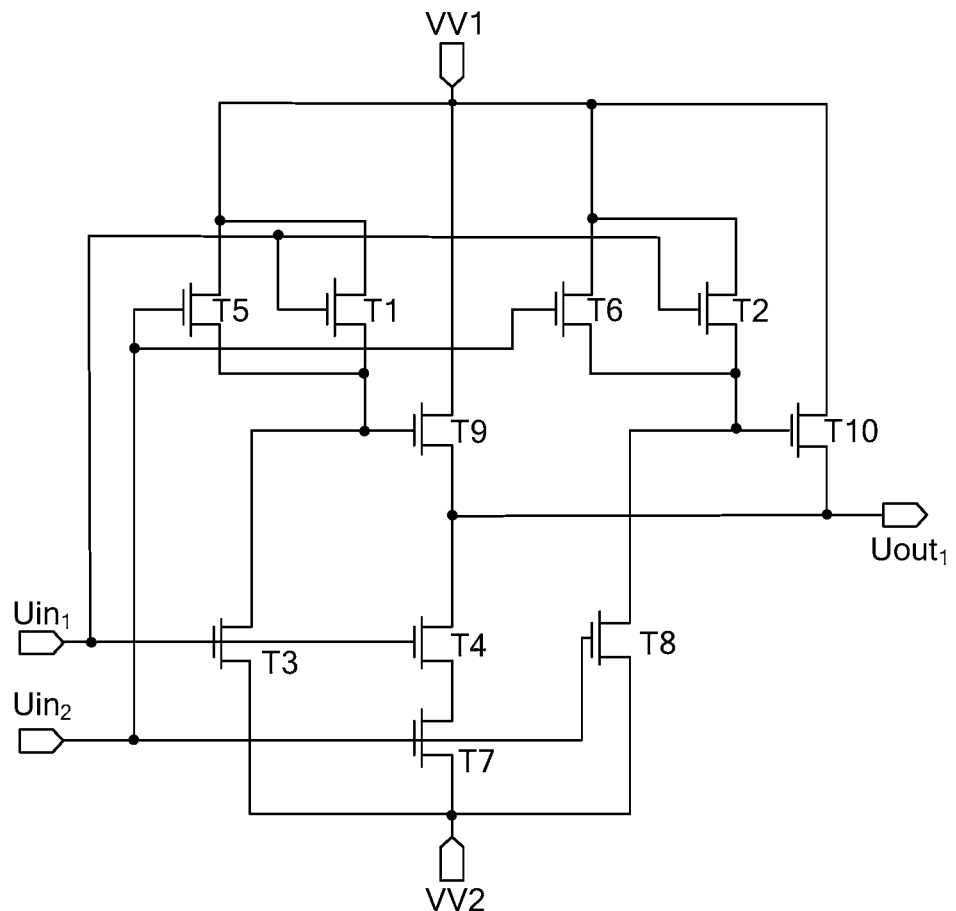
FIG. 1 is one structure schematic diagram for a logic unit circuit provided in an embodiment of the present disclosure.

Firstly, there is provided in an embodiment of the present disclosure a logic unit circuit as shown in FIG. 1, comprising a first transistor T1, a second transistor T2, a third transistor T3, a fourth transistor T4, a fifth transistor T5, a sixth transistor T6, a seventh transistor T7, an eighth transistor T8, a ninth transistor T9, and a tenth transistor T10 of a same type. In this embodiment, all the transistors are N type transistors.

Herein, a gate of the first transistor T1, a gate of the second transistor T2, a gate of the third transistor T3, and a gate of the fourth transistor T4 are connected to a first input terminal $Uin_1$.

A first electrode of the first transistor T1 is connected to a first voltage terminal VV1, and a second electrode thereof is connected to a gate of the ninth transistor T9. A first electrode of the second transistor T2 is connected to the first voltage terminal VV1, and a second electrode thereof is connected to a gate of the tenth transistor T10. A first electrode of the third transistor T3 is connected to the gate of the ninth transistor T9, and a second electrode thereof is connected to a second voltage terminal VV2. A first electrode of the fourth transistor T4 is connected to a first output terminal $Uout_1$, and a second electrode thereof is connected to a first electrode of the seventh transistor T7.

A gate of the fifth transistor T5, a gate of the sixth transistor T6, a gate of the seventh transistor T7, and a gate of the eighth transistor T8 are all connected to a second input terminal $Uin_2$.

A first electrode of the fifth transistor T5 is connected to the first voltage terminal VV1, and a second electrode thereof is connected to the gate of the ninth transistor T9. A first electrode of the sixth transistor T6 is connected to the first voltage terminal VV1, and a second electrode thereof is connected to the gate of the tenth transistor T10. A second electrode of the seventh transistor T7 is connected to the second voltage terminal VV2. A first electrode of the eighth transistor T8 is connected to the gate of the tenth transistor T10, and a second electrode thereof is connected to the second voltage terminal VV2.

A first electrode of the ninth transistor T9 is connected to the first voltage terminal VV1, and a second electrode thereof is connected to the first output terminal $Uout_1$. A first electrode of the tenth transistor T10 is connected to the first voltage terminal VV1, and a second electrode thereof is connected to the first output terminal Uout$_1$.

Figure 2:
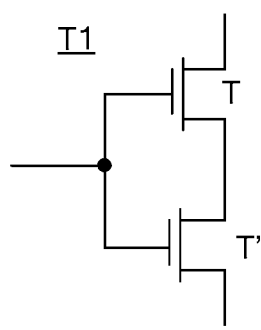
FIG. 2 is one structure schematic diagram for a first transistor in the logic unit circuit as shown in FIG. 1.

It needs to note that, firstly, each of the above transistors may be an independent transistor, or may be a combination of a plurality of transistors of the same type. By taking the first transistor T1 as an example, the first transistor T1 can comprise one transistor as shown in FIG. 1. Or, as shown in FIG. 2, the first transistor T1 comprises a transistor T and a transistor T', wherein a gate of the transistor T is connected to a gate of the transistor T', a second electrode of the transistor T is connected to a first electrode of the transistor T'; herein, the gate of the transistor T (or the gate of the transistor T') is taken as the gate of the first transistor T1, a first electrode of the transistor T is taken as the first electrode of the first transistor T1, and a second electrode of the transistor T' is taken as the second electrode of the first transistor T1.

Secondly, in the embodiment, a first electrode of the transistor is a drain, and a second electrode thereof is a source. In the logic unit circuit provided in the embodiment of the present disclosure, each transistor can be field effect transistors (MOS) of a same type, or can be thin film transistors (TFT) of a same type, to which the present disclosure does not limit.

Based on this, the embodiment of the present invention provides a logic unit circuit. Since each of the transistors in the logic unit circuit is a transistor of the same type, it can solve the problem that technical difficulties are increased due to mixed used of different types of transistors in the existing logic unit circuit.

An operation process of the logic unit circuit as shown in FIG. 1 and provided in the embodiment of the present disclosure will be described below.

A first voltage is input to the first voltage terminal VV1, a second voltage is input to the second voltage terminal VV2, a first signal U1 is input to the first input terminal Uin$_1$, and a second signal U2 is input to the second input terminal Uin$_2$. Herein, the first voltage is greater than the second voltage. Exemplarily, the voltage of the first voltage terminal VV1 can be 20V, and the voltage of the second voltage terminal VV2 can be −10V.

When U1=1, U2=0, the first transistor T1, the second transistor T2, the third transistor T3, and the fourth transistor T4 are in a turn-on state. The fifth transistor T5, the sixth transistor T6, the seventh transistor T7, and the eighth transistor T8 are in a turn-off state.

Since the first transistor T1 is turned on, a potential of the gate of the ninth transistor T9 is pulled up to the first voltage terminal VV1; since the third transistor T3 is turned on, the potential of the gate of the ninth transistor T9 is pulled down to the second voltage terminal VV2. By setting channel dimension scale of the first transistor T1 and the third transistor T3, for example, setting that a channel width-length ratio of the first transistor T1 is smaller than a channel width-length ratio of the third transistor T3, the potential of the gate of the ninth transistor T9 is pulled down to the second voltage terminal VV2, that is, the potential of the gate of the ninth transistor T9 becomes a low potential. Therefore, the ninth transistor T9 is in the turn-off state.

Since the second transistor T2 is turned on and the eighth transistor T8 is turned off, then a potential of the gate of the tenth transistor T10 is pulled up to the first voltage terminal VV1, that is, the potential of the gate of the tenth transistor T10 becomes a high potential. Therefore, the tenth transistor T10 is in the turn-on state. At this time, the potential of the first output terminal Uout$_1$ is pulled up to the first voltage terminal VV1 through the tenth transistor T10, that is, an output signal of the first output terminal Uout$_1$ is U0=1.

When U1=0, U2=1, the fifth transistor T5, the sixth transistor T6, the seventh transistor T7, and the eighth transistor T8 are in the turn-on state. The first transistor T1, the second transistor T2, the third transistor T3, and the fourth transistor T4 are in the turn-off state.

Since the sixth transistor T6 is turned on, the potential of the gate of the tenth transistor T10 is pulled up to the first voltage terminal VV1; since the eighth transistor T8 is turned on, the potential of the gate of the tenth transistor T10 is pulled down to the second voltage terminal VV2. By setting channel dimension scale of the sixth transistor T6 and the eighth transistor T8, for example, setting that a channel width-length ratio of the sixth transistor T6 is smaller than a channel width-length ratio of the eighth transistor T8, the potential of the gate of the tenth transistor T10 is pulled down to the second voltage terminal VV2, that is, the potential of the gate of the tenth transistor T10 becomes a low potential. Therefore, the tenth transistor T10 is in the turned-off state.

Since the fifth transistor T5 is turned on and the third transistor T3 is turned off, the potential of the gate of the ninth transistor T9 is pulled up to the first voltage terminal VV1, that is, the potential of the gate of the ninth transistor T9 becomes a high potential. Therefore, the ninth transistor T9 is in the turn-on state. At this time, the potential of the first output terminal Uout$_1$ is pulled up to the first voltage terminal VV1 through the ninth transistor T9, that is, the output signal of the first output terminal Uout$_1$ is U0=1.

When U1=1, U2=1, the first transistor T1, the second transistor T2, the third transistor T3, the fourth transistor T4, the fifth transistor T5, the sixth transistor T6, the seventh transistor T7, and the eighth transistor T8 are in the turn-on state.

By combining with the above descriptions, the potential of the gate of the ninth transistor T9 is pulled down to the second voltage terminal VV2 through the third transistor T3, and the potential of the gate of the tenth transistor T10 is pulled down to the second voltage terminal VV2 through the eight transistor T8, that is, gates of both the ninth transistor T9 and the tenth transistor T10 are at low potentials. Therefore, the ninth transistor T9 and the tenth transistor T10 are in the turn-off state.

Since the fourth transistor T4 and the seventh transistor T7 are turned on, the potential of the first output terminal Uout$_1$ is pulled down to the second voltage terminal VV2, that is, the output signal of the first output terminal Uout$_1$ is U0=0.

When U1=0, U2=0, the first transistor T1, the second transistor T2, the third transistor T3, the fourth transistor T4, the fifth transistor T5, the sixth transistor T6, the seventh transistor T7, and eighth transistor T8 are all in the turn-off state. At this time, the ninth transistor T9 and the tenth transistor T10 are in the turn-off state. Therefore, the output signal of the first output terminal Uout$_1$ is U0=0.

Based on this, the logic unit circuit provided in the embodiment of the present invention can realize the exclusive-OR function, that is, the above logic unit circuit forms an exclusive-OR gate circuit.

On this basis, when U1=0, U2=0, the gates of the ninth transistor T9 and the tenth transistor T10 are in a floating state, which is likely to bring a high voltage, so that the output signal U0 of the first output terminal Uout$_1$ is 1. That is, when input signals of the first input terminal Uin$_1$ and the second input terminal Uin$_2$ are at a low level, the logic unit circuit has a problem of unstable output.

Figure 4:
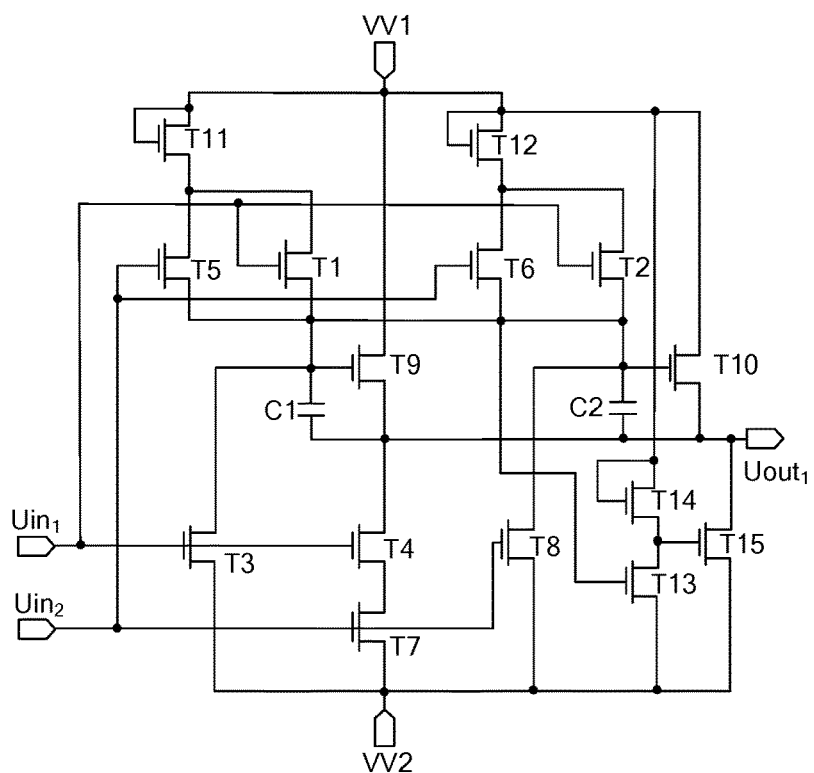
FIG. 4 is another structure schematic diagram for a logic unit circuit provided in an embodiment of the present disclosure.

In order to solve the above problem, optionally, the logic unit circuit provided in the embodiment of the present disclosure further comprises a thirteen transistor T13, a fourteenth transistor T14, and a fifteenth transistor T15, as shown in FIG. 4.

A gate of the thirteenth transistor T13 is connected to the second electrode of the first transistor T1, the second electrode of the second transistor T2, the second electrode of the fifth transistor T5, and the second electrode of the sixth transistor T6, a first electrode of the thirteenth transistor T13 is connected to a second electrode of the fourteenth transistor T14 and a gate of the fifteenth transistor T15, and a second electrode of the thirteenth transistor T13 is connected to the second voltage terminal VV2. A gate and a first electrode of the fourteenth transistor T14 are connected to the first voltage terminal VV1. A first electrode of the fifteenth transistor 15 is connected to the first output terminal Uout$_1$, and a second electrode thereof is connected to the second voltage terminal VV2.

In this way, the first signal U1 is input to the first input terminal Uin$_1$, and the second signal U2 is input to the second input terminal Uin$_2$. When U1=0, U2=0, the fourteenth transistor T14 is turned on, and a potential of the gate of the fifteenth transistor T15 is pulled up to the first voltage terminal VV1. Therefore, the fifteenth transistor T15 is in the turn-on state, so that the potential of the first output terminal Uout$_1$ is pulled down to the second voltage terminal VV2, that is, the potential of the first output terminal Uout$_1$ becomes a low potential. In this way, the problem of unstable output of the logic unit circuit can be eliminated when the input signals of the first input terminal Uin$_1$ and the second input terminal Uin$_2$ are at a low level.

On such a basis, when one of the input signals of the first input terminal Uin$_1$ and the second input terminal Uin$_2$ is at a high level, that is, when at least one of the first transistor T1 and the second transistor T2 or at least one of the fifth transistor T5 and the sixth transistor T6 is in the turn-on state, a potential of the gate of the thirteenth transistor T13 would be pulled up to the first voltage terminal VV1, so that the thirteenth transistor T13 is in the turn-on state. At this time, the gate of the fifteenth transistor T15 is pulled down to the second voltage terminal VV2, so that the fifth transistor T15 does not work because it is in the turn-off state. Therefore, it would not affect the normal output of the logic unit circuit.

Figure 3:
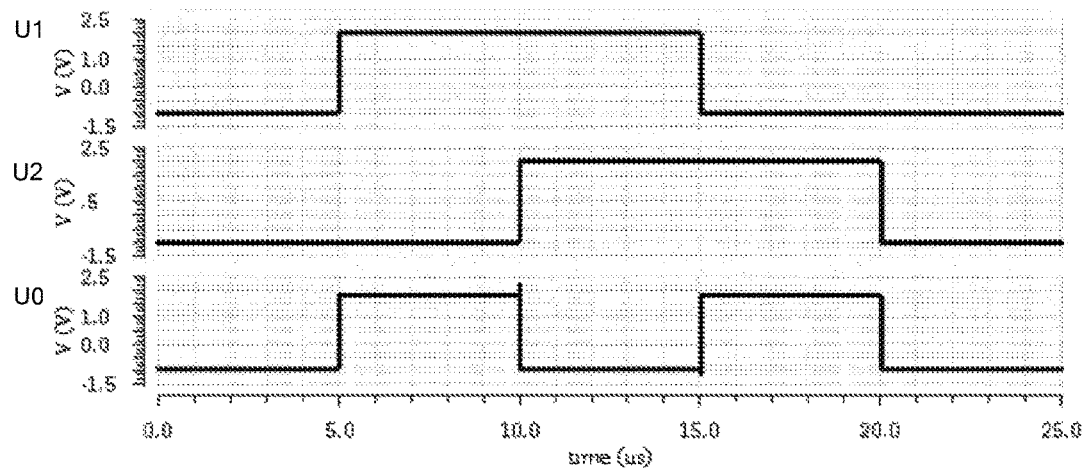
FIG. 3 is a schematic diagram when there is a threshold voltage loss at an output signal of a first output terminal in the logic unit circuit as shown in FIG. 1.

On such a basis, in the above logic unit circuit, the voltage of the first voltage terminal VV1 is transmitted from the gate to the source (the second electrode) through the ninth transistor T9. Now, the voltage obtained from the source of the ninth transistor T9 has a threshold loss, and thus the output signal of the first output terminal Uout$_1$ has a threshold voltage loss. Exemplarily, as shown in FIG. 3, when U1 is 2.5V, U2 is 2.5V, since the voltage obtained from the source of the ninth transistor T9 has a threshold loss, the output signal U0 of the first output terminal Uout$_1$ is smaller than 2.5V, and there is a threshold voltage loss.

In order to eliminate the above phenomenon, optionally, as shown in FIG. 4, the logic unit circuit provided in the embodiment of the present disclosure further comprises a first capacitor C1, whose one terminal is connected to the gate of the ninth transistor T9, and another terminal is connected to the first output terminal Uout$_1$.

It is known for those skilled in the art that when a gate-source voltage $U_{GS}$ and a source-drain voltage $U_{DS}$ of the transistor satisfies $U_{GS}-U_{DS}>U_{TH}$, the transistor is in the turn-on state. According to FIG. 4, a gate-source voltage of the ninth transistor T9 is $U_{GS}=U_G-U_S$, and a source-drain voltage of the ninth transistor T9 is $U_{DS}=U_D-U_S$. Since the first capacitor C1 has a bootstrap effect, it can make a voltage difference between voltages at two terminals of the capacitor C1 maintain unchanged basically, that is, it can make the gate-source voltage $U_{GS}$ maintain unchanged basically. In this way, in order to ensure $U_{GS}$ to maintain unchanged basically, the source voltage Us of the ninth transistor T9 would be pulled up. Since the source voltage $U_S$ increases, the source-drain voltage $U_{DS}$ would reduce. In this circumstance, $U_{GS}\gg U_{DS}$. In this way, due to $U_{GS}-U_{DS}\gg U_{TH}$, the ninth transistor T9 can be turned on sufficiently, so as to eliminate the threshold voltage loss of the ninth transistor T9. Further, the threshold voltage loss at the output signal of the first output terminal Uout$_1$ is eliminated.

As described in the same way, in order to eliminate a threshold voltage loss of the tenth transistor T10, optionally, the logic unit circuit provided in the embodiment of the present disclosure further comprises a second capacitor C2, whose one terminal is connected to the gate of the tenth transistor T10, and another terminal is connected to the first output terminal Uout$_1$. Under these circumstances, by utilizing bootstrap effect of the second capacitor C2, the tenth transistor T10 is made sufficiently turned on, so as to eliminate the threshold voltage loss of the tenth transistor T10, and further to eliminate the threshold voltage loss at the output signal of the first output terminal Uout$_1$.

On such a basis, when the output signal U0 of the first output terminal Uout$_1$ is converted from a low level into a high level, since the first capacitor C1 and the second capacitor C2 can make the ninth transistor T9 and the tenth transistor T10 sufficiently turned on respectively, output speed of the high level can be raised. In this way, the output signal of the logic unit circuit has a faster conversion speed when it is converted from the low level into the high level.

Optionally, as shown in FIG. 4, the logic unit circuit provided in the embodiment further comprises an eleventh transistor T11, whose gate and first electrode are connected to the first voltage terminal VV1, second electrode is connected to the first electrode of the first transistor T1 and the first electrode of the fifth transistor T5.

On such a basis, the gate and the first electrode of the eleventh transistor T11 are connected. Now, the eleventh transistor T11 equates to a diode, and can perform a function of dividing a voltage flowing from the first voltage terminal VV1 to the gate of the ninth transistor T9, so as to prevent a problem that the voltage of the gate of the ninth transistor T9 has a large glitch when a quite high voltage is flown to the gate of the ninth transistor T9.

Optionally, as shown in FIG. 4, the logic unit circuit provided in the embodiment of the present disclosure further comprises a twelfth transistor T12, whose gate and first electrode are connected to the first voltage terminal VV1, and second electrode is connected to the first electrode of the second transistor T2 and the first electrode of the sixth transistor T6. The twelfth transistor T12 performs the same function as the eleventh transistor T11, and thus no further description is given herein.

Figure 5:
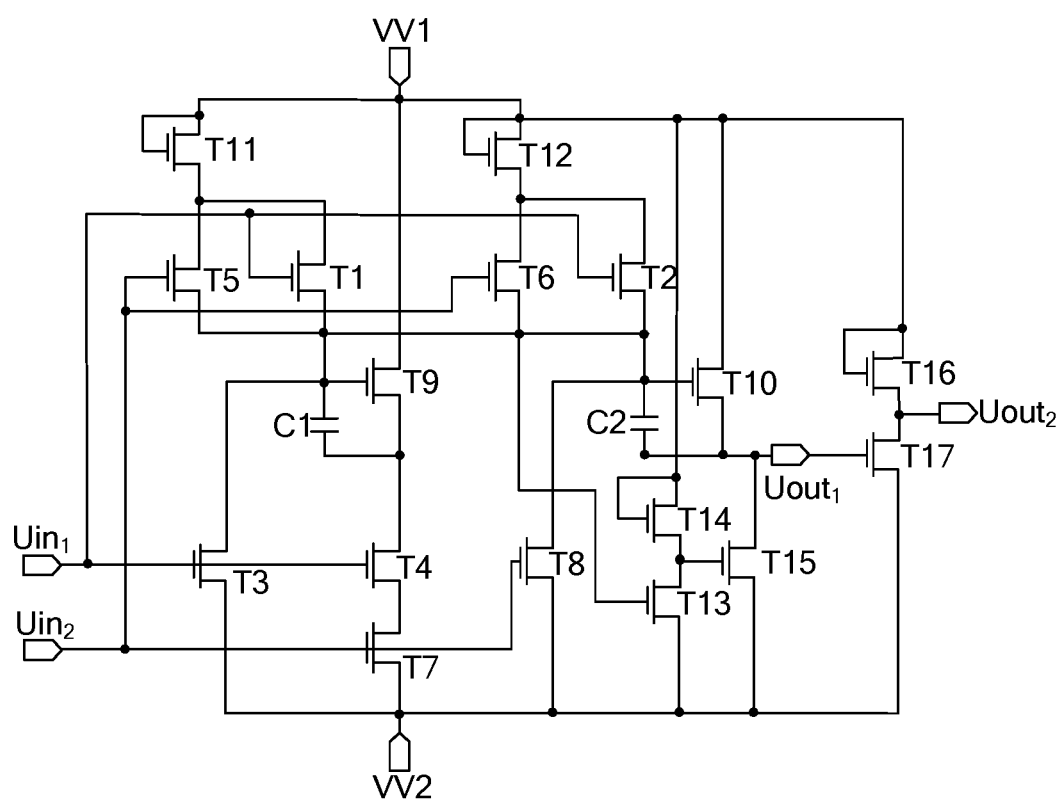
FIG. 5 is a structure schematic diagram when the logic unit circuit as shown in FIG. 4 comprises a sixteenth transistor and a seventeenth transistor.

On such a basis, optionally, the logic unit circuit further comprises a sixteenth transistor T16 and a seventeenth transistor T17 as shown in FIG. 5. A gate and a first electrode of the sixteenth transistor T16 are connected to the first voltage terminal VV1, and a second electrode thereof is connected to the second output terminal Uout$_2$. A gate of the seventeenth transistor T17 is connected to the first output terminal Uout$_1$, a first electrode thereof is connected to the second output terminal Uout$_2$, and a second electrode thereof is connected to the second voltage terminal VV2. The sixteenth transistor T16 and the seventeenth transistor T17 constitute an inverter.

When the output signal of the first output terminal $Uout_1$ is U0=1, the sixteenth transistor T16 is in the turn-on state, the seventeenth transistor T17 is in the turn-on state, and the potential of the second output terminal $Uout_2$ is pulled down to the second voltage terminal VV2 through the seventeenth transistor T17. At this time, the output signal of the second output terminal $Uout_2$ is U0'=0.

When the output signal of the first output terminal $Uout_1$ is U0=0, the sixteenth transistor T16 is in the turn-on state, the seventeenth transistor T17 is in the turn-off state, and the potential of the second output terminal $Uout_2$ is pulled up to the first voltage terminal VV1 through the seventeenth transistor T17. At this time, the output signal of the second output terminal $Uout_2$ is U0'=1.

In this way, the sixteenth transistor T16 and the seventeenth transistor T17 can perform phase inversion on the output signal U0 of the first output terminal $Uout_1$, so that the second signal terminal $Uout_2$ outputs a signal obtained by performing exclusive-NOR on the first signal U1 and the second signal U2. Thus, the logic unit circuit forms an exclusive-NOR gate circuit.

It needs to note that the inverter composed of the sixteenth transistor T16 and the seventeenth transistor T17 is just one example of the embodiment of the present disclosure. When an inverter with other structure is applied to the logic unit circuit to invert the phase of the output signal U0 of the first output terminal $Uout_1$, an exclusive-NOR gate circuit is obtained, which also falls into the protection scope of the present disclosure.

It needs to note that in the present embodiment, the first transistor T11, the twelfth transistor T12, the thirteenth transistor T13, the fourteenth transistor T14, the fifteenth transistor T15, the sixteenth transistor T16 and the seventeenth transistor T17 are N type transistors.

Figure 6:
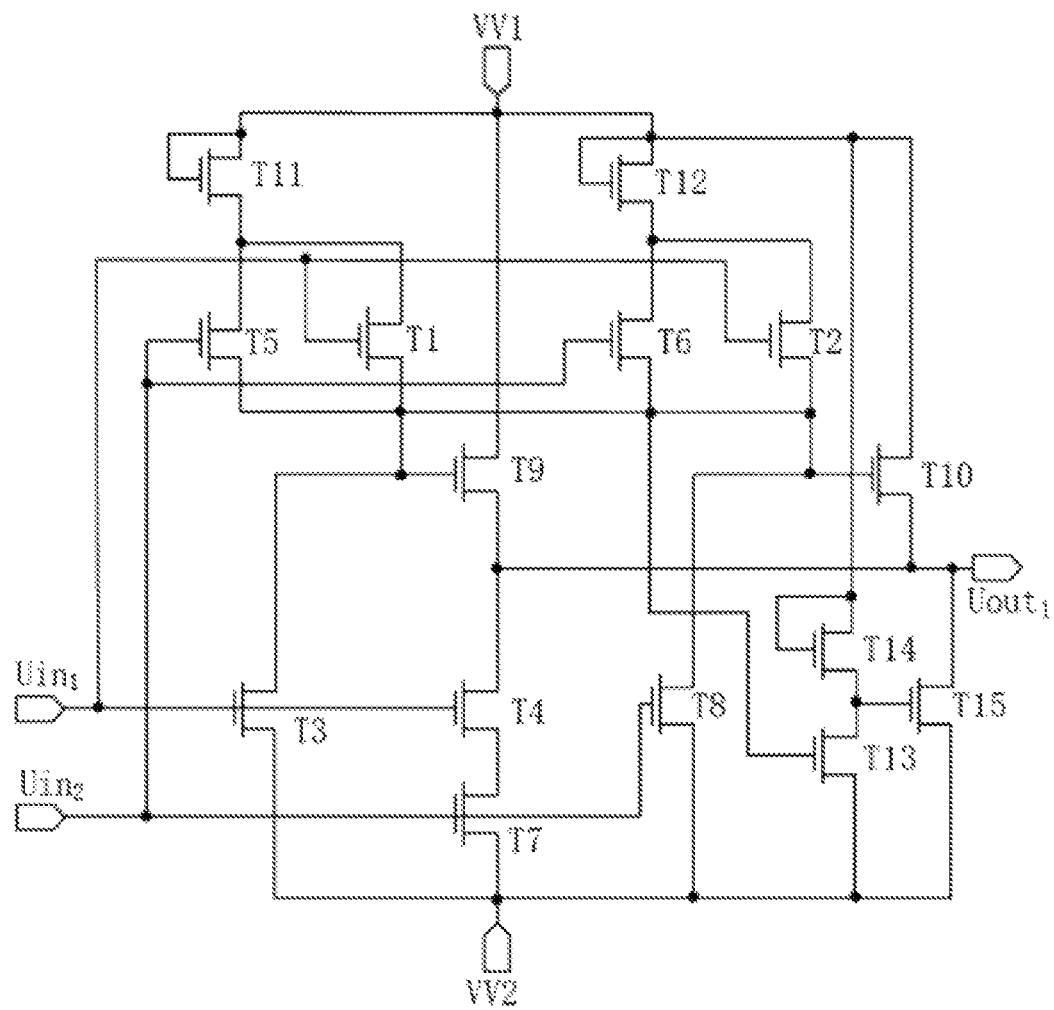
FIG. 6 is a structure schematic diagram when each transistor in a logic unit circuit provided in an embodiment of the present disclosure is P type transistor.

Secondly, there is provided in an embodiment of the present disclosure a logic unit circuit, as shown in FIG. 6, comprising a first transistor T1, a second transistor T2, a third transistor T3, a fourth transistor T4, a fifth transistor T5, a sixth transistor T6, a seventeenth transistor T7, an eighth transistor T8, a ninth transistor T9, a tenth transistor T10, a thirteenth transistor T13, a fourteenth transistor T14, and a fifteenth transistor T15 of the same type. Herein, connection manners of transistors are the same as connection manners of respective transistors in embodiment 1. Each of the transistors is P type transistor.

A specific operation process of the circuit will be described below. A third voltage is input to the first voltage terminal VV1 in the logic unit circuit as shown in FIG. 5, a fourth voltage is input to the second voltage terminal VV2, a first signal U1 is input to the first input terminal $Uin_1$, and a second signal U2 is input to the second input terminal $Uin_2$. Herein, the third voltage is smaller than the fourth voltage.

When U1=1, U2=0, the fifth transistor T5, the sixth transistor T6, the seventh transistor T7, the eighth transistor T8, and the fourteenth transistor T14 are in the turn-on state. The first transistor T1, the second transistor T2, the third transistor T3, and the fourth transistor T4 are in the turn-off state.

Since the fourteenth transistor T14 is turned on, a potential of the gate of the fifteenth transistor T15 is pulled down to the first voltage terminal VV1; since the fifth transistor T5 and the sixth transistor T6 are turned on, a potential of the gate of the thirteenth transistor T13 is pulled down to the first voltage terminal VV1. By setting channel dimension scale of the thirteenth transistor T13 and the fourteenth transistor T14, for example, setting that a channel width-length ratio of the thirteen transistor T13 is greater than a channel width-length ratio of the fourteenth transistor T14, a potential of the gate of the fifteenth transistor T15 is pulled up to the second voltage terminal VV2, that is, the potential of the gate of the fifteenth transistor T15 becomes a high potential. At this time, the fifth transistor T15 is in the turn-off state.

Since the sixth transistor T6 is turned on, the potential of the gate of the tenth transistor T10 is pulled down to the first voltage terminal VV1; since the eighth transistor T8 is turned on, the potential of the gate of the tenth transistor T10 is pulled up to the second voltage terminal VV2. By setting channel dimension scale of the sixth transistor T6 and the eighth transistor T8, for example, setting that a channel width-length ratio of the sixth transistor T6 is smaller than a channel width-length ratio of the eighth transistor T8, so that the potential of the gate of the tenth transistor T10 is pulled up to the second voltage terminal VV2, that is, the potential of the gate of the tenth transistor T10 becomes a high potential. Therefore, the tenth transistor T10 is in the turn-off state.

Since the fifth transistor T5 is turned on and the third transistor T3 is turned off, the potential of the gate of the ninth transistor T9 is pulled down to the first voltage terminal VV1, that is, the potential of the gate of the ninth transistor T9 becomes a low potential. Therefore, the ninth transistorT9 is in the turn-on state. At this time, the potential of the first output terminal $Uout_1$ is pulled down to the first voltage terminal VV1, that is, the output signal of the first output terminal $Uout_1$ is U0=0.

When U1=0, U2=1, the first transistor T1, the second transistor T2, the third transistor T3, the fourth transistor T4, and the fourteenth transistor T14 are in the turn-on state. The fifth transistor T5, the sixth transistor T6, the seventh transistor T7, and the eighth transistor T8 are in the turn-off state.

By combining with the above description, since the first transistor T1 and the second transistor T2 are turned on, the fifteenth transistor T15 is in the turn-off state.

Since the first transistor T1 is turned on, the potential of the gate of the ninth transistor T9 is pulled down to the first voltage terminal VV1; since the third transistor T3 is turned on, the potential of the gate of the ninth transistor T9 is pulled up to the second voltage terminal VV2. By setting dimension scale of the first transistor T1 and the third transistor T3, for example, setting that a channel width-length ratio of the first transistor T1 is smaller than a channel width-length ratio of the third transistor T3, the potential of the gate of the ninth transistor T9 is pulled up to the second voltage terminal VV2, that is, the potential of the gate of the ninth transistor T9 becomes a high potential. Therefore, the ninth transistor T9 is in the turn-off state.

Since the second transistor T2 is turned on and the eighth transistor T8 is turned off, the potential of the gate of the tenth transistor T10 is pulled down to the first voltage terminal VV1, that is, the potential of the gate of the tenth transistor T10 becomes the low potential. Therefore, the tenth transistor T10 is in the turn-on state. At this time, the potential of the first output terminal $Uout_1$ is pulled down to the first voltage terminal VV1, that is, the output signal of the first output terminal $Uout_1$ is U0=0.

When U1=1, U2=1, the first transistor T1, the second transistor T2, the third transistor T3, the fourth transistor T4, the fifth transistor T5, the sixth transistor T6, the seventh transistor T7, and the eighth transistor T8 are in the turn-off state. The fourteenth transistor T14 is in the turn-on state.

Since the first transistor T1, the second transistor T2, the fifth transistor T5, and the sixth transistor T6 are turned off, the gate of the thirteenth transistor T13 is in a floating state, so that the thirteenth transistor T13 is in the turn-off state.

Since the fourteenth transistor T14 is turned on, the potential of the gate of the fifteenth transistor T15 is pulled down to the first voltage terminal VV1. At this time, the fifteenth transistor T15 is in the turn-on state. At this time, the potential of the first output terminal $Uout_1$ is pulled up to the second voltage terminal VV2, that is, the output signal of the first output terminal $Uout_1$ is U0=1.

When U1=0, U2=0, the first transistor T1, the second transistor T2, the third transistor T3, the fourth transistor T4, the fifth transistor T5, the sixth transistor T6, the seventh transistor T7, the eighth transistor T8, and the fourteenth transistor T14 are in the turn-on state.

By combining with the above, since the first transistor T1, the second transistor T2, the fifth transistor T5, and the sixth transistor T6 are turned on, the fifteenth transistor T15 is in the turn-off state.

Since the fourth transistor T4 and the seventh transistor T7 are turned on, the potential of the first output terminal $Uout_1$ is pulled up to the second voltage terminal VV2, that is, the output signal of the first output terminal $Uout_1$ is U0=1.

On this basis, there is provided in the embodiment of the present disclosure a logic unit circuit. Since each of the transistors in the logic unit circuit is transistor of the same type, it can solve the problem that technical difficulties are increased due to mixed use of different types of transistors in the existing logic unit circuit.

Additionally, by combining with the above, in the logic unit circuit provided in the embodiment of the present disclosure, the third voltage is input to the first voltage terminal VV1, the fourth voltage is input to the second voltage terminal VV2, and the third voltage is smaller than the fourth voltage. When the first signal U1 is input to the first input terminal $Uin_1$ and the second signal U2 is input to the second input terminal $Uin_2$, the first output terminal $Uout_1$ is capable of outputting a signal obtained by performing exclusive-NOR on the first signal U1 and the second signal U2. That is, the above logic unit circuit forms an exclusive-NOR gate circuit.

Optionally, as shown in FIG. 6, the logic unit circuit further comprises an eleventh transistor T11, whose gate and first electrode are connected to the first voltage terminal VV1, and second electrode is connected to the first electrode of the first transistor T1 and the first electrode of the fifth transistor T5.

Optionally, as shown in FIG. 6, the logic unit circuit further comprises a twelfth transistor T12, whose gate and first electrode are connected to the first voltage terminal VV1, and second electrode is connected to the first electrode of the second transistor T2 and the first electrode of the sixth transistor T6.

On this basis, the eleventh transistor T11 and the second transistor T2 perform the same function in the embodiment as that in embodiment 1, and thus no further descriptions are given herein.

Figure 7:
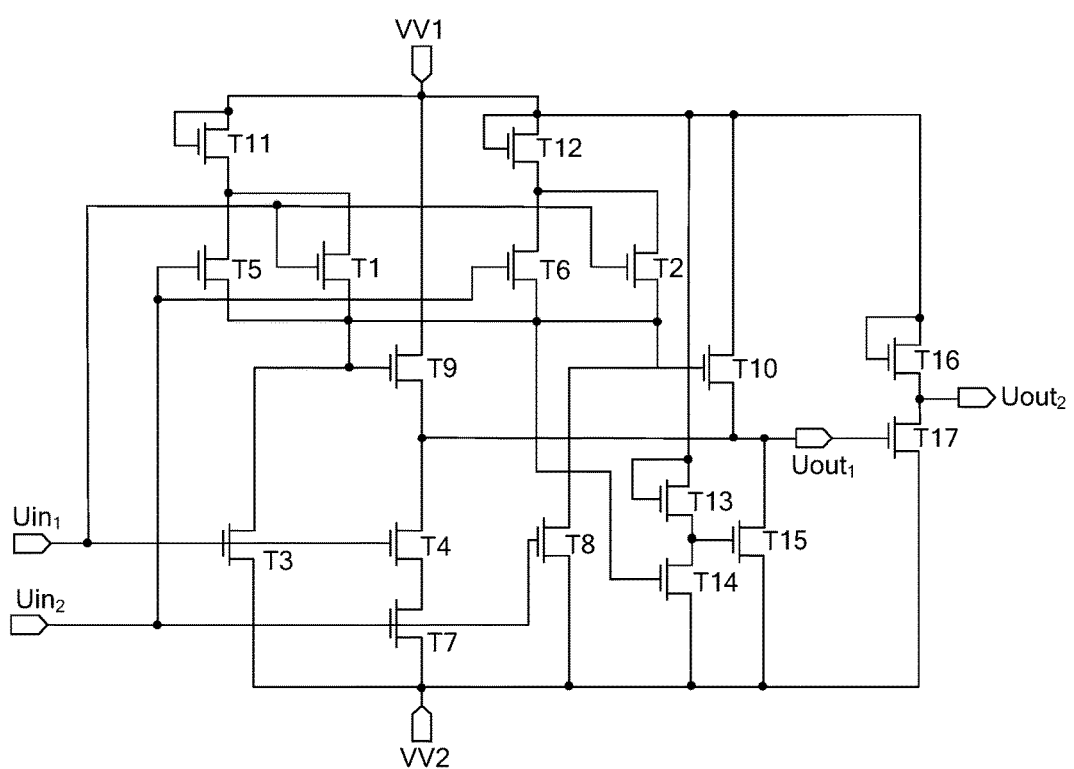
FIG. 7 is a structure schematic diagram when the logic unit circuit as shown in FIG. 6 comprises a sixteenth transistor and a seventeenth transistor.

On this basis, optionally, the logic unit circuit provided in the embodiment of the present disclosure further comprises a sixteenth transistor T16 and a seventeenth transistor T17 as shown in FIG. 7. A gate and a first electrode of the sixth transistor T16 are connected to the first voltage terminal VV1, and a second electrode thereof is connected to the second output terminal $Uout_2$. A gate of the seventeenth transistor T17 is connected to the first output terminal $Uout_1$, a first electrode thereof is connected to the second output terminal $Uout_2$, and a second electrode thereof is connected to the second voltage terminal VV2. The sixteenth transistor T16 and the seventeenth transistor T17 constitute an inverter.

When the output signal of the first output terminal $Uout_1$ is U0=1, the sixteenth transistor T16 is in the turn-on state, and the seventeenth transistor T17 is in the turn-off state. At this time, the potential of the second output terminal $Uout_2$ is pulled down to the first voltage terminal VV1, that is, the output signal of the second output terminal $Uout_2$ is U0'=0.

When the output signal of the first output terminal $Uout_1$ is U0=0, the sixteenth transistor T16 is in the turn-on state, and the seventeenth transistor T17 is in the turn-on state. At this time, the potential of the second output terminal $Uout_2$ is pulled up to the second voltage terminal VV2, that is, the output signal of the second output terminal $Uout_2$ is U0'=1.

In this way, the sixteenth transistor T16 and the seventeenth transistor T17 can perform phase conversion on the output signal U0 of the first output terminal $Uout_1$, so that the second signal terminal $Uout_2$ outputs a signal obtained by performing exclusive-OR on the first signal U1 and the second signal U2. Therefore, the logic unit circuit forms an exclusive-OR gate circuit.

It needs to note that the inverter composed of the sixteenth transistor T16 and the seventeenth transistor T17 is one example of the embodiment of the present disclosure. When an inverter with other structure is applied to the above logic unit circuit to perform phase conversion on the output signal U0 of the first output terminal $Uout_1$, an exclusive-OR gate circuit is obtained, which also falls into the protection scope of the present disclosure.

It needs to note that in the embodiment, the eleventh transistor T11, the twelfth transistor T12, the sixteenth transistor T16, and the seventeenth transistor T17 are P type transistors.

Thirdly, there is provided in an embodiment of the present disclosure a method for driving the logic unit circuit as described in embodiment 1, comprising: inputting a first voltage to a first voltage terminal VV1, inputting a second voltage to a second voltage terminal VV2, inputting a first signal U1 to a first input terminal $Uin_1$, and inputting a second signal U2 to a second input terminal $Uin_2$, so that the first output terminal $Uout_1$ outputs the signal U0 obtained by performing exclusive-OR on the first signal U1 and the second signal U2, wherein the first voltage is greater than the second voltage.

It needs to note that the specific structure and operation process of the above logic unit circuit have been described in detail in embodiment 1, and thus no further description is given herein.

Since transistors in the logic unit circuit provided in embodiment 1 are transistors of the same type, it can solve the problem that technical difficulties are increased due to mixed used of different types of transistors in the existing logic unit circuit.

Fourthly, there is provided in the embodiment of the present disclosure a method for driving the logic unit circuit as described in embodiment 2, comprising: inputting a third voltage to a first voltage terminal VV1, inputting a fourth voltage to a second voltage terminal VV2, inputting a first signal to a first input terminal $Uin_1$, and inputting a second signal to a second input terminal $Uin_2$, so that the first output terminal $Uout_1$ outputs a signal U0 obtained by performing exclusive-NOR on the first signal U1 and the second signal U2. Herein, the third voltage is smaller than the fourth voltage.

It needs to specify that the specific structure and operation process of the above logic unit circuit have been described in detail in Embodiment 2, and thus nor further descriptions are given herein.

Since transistors in the logic unit circuit provided in embodiment 1 are transistors of the same type, it can solve the problem that technical difficulties are increased due to mixed used of different types of transistors in the existing logic unit circuit.

Fifthly, there is provided in an embodiment of the present disclosure a pixel driving circuit, comprising the logic unit circuit according to Embodiment 1 or Embodiment 2, which has the same structure and beneficial effects as the logic unit circuit provided in the embodiment of the present embodiment. The above embodiments have described the structure and beneficial effects of the logic unit circuit in detail, and thus no further description is given herein.

Exemplarily, the pixel driving circuit provided in the embodiment of the present disclosure can be a gate driving circuit. The portion of the circuit in the gate driving circuit used for performing exclusive-OR logic operation process can be realized by the logic unit circuit. Exemplarily, the pixel driving circuit can be a scan driving circuit.

The above descriptions are just specific embodiments of the present disclosure, but the protection scope of the present disclosure is not limited thereto. Any alternation or replacement that can be easily conceived by those skilled in the art who are familiar with the technical field within the technical scope of the present disclosure shall be covered in the protection scope of the present disclosure. Therefore, the protection scope of the present disclosure shall be subject to the protection scope of the claims.

What is claimed is:

1. A logic unit circuit, comprising: a first transistor, a second transistor, a third transistor, a fourth transistor, a fifth transistor, a sixth transistor, a seventh transistor, an eighth transistor, a ninth transistor, and a tenth transistor of a same type, wherein
    a gate of the first transistor, a gate of the second transistor, a gate of the third transistor, and a gate of the fourth transistor are connected to a first input terminal;
    a first electrode of the first transistor is connected to a first voltage terminal, and a second electrode thereof is connected to a gate of the ninth transistor; a first electrode of the second transistor is connected to the first voltage terminal, and a second electrode thereof is connected to a gate of the tenth transistor; a first electrode of the third transistor is connected to the gate of the ninth transistor, and a second electrode thereof is connected to a second voltage terminal; a first electrode of the fourth transistor is connected to a first output terminal, and a second electrode thereof is connected to a first electrode of the seventh transistor;
    a gate of the fifth transistor, a gate of the sixth transistor, a gate of the seventh transistor, and a gate of the eighth transistor are connected to a second input terminal;
    a first electrode of the fifth transistor is connected to the first voltage terminal, and a second electrode thereof is connected to the gate of the ninth transistor; a first electrode of the sixth transistor is connected to the first voltage terminal, and a second electrode thereof is connected to the gate of the tenth transistor; a second electrode of the seventh transistor is connected to the second voltage terminal; a first electrode of the eighth transistor is connected to the gate of the tenth transistor, and a second electrode thereof is connected to the second voltage terminal;
    a first electrode of the ninth transistor is connected to the first voltage terminal, and a second electrode thereof is connected to the first output terminal; a first electrode of the tenth transistor is connected to the first voltage terminal, and a second electrode thereof is connected to the first output terminal.

2. The logic unit circuit according to claim 1, the logic unit circuit further comprises an eleventh transistor, whose gate and first electrode are connected to the first voltage terminal, and second electrode is connected to the first electrode of the first transistor and the first electrode of the fifth transistor.

3. The logic unit circuit according to claim 2, the logic unit circuit further comprises a thirteenth transistor, a fourteenth transistor, and a fifteenth transistor, wherein
    a gate of the thirteenth transistor is connected to the second electrode of the first transistor, the second electrode of the second transistor, the second electrode of the fifth transistor, and the second electrode of the sixth transistor, a first electrode thereof is connected to a second electrode of the fourteenth transistor and a gate of the fifteenth transistor, and a second electrode thereof is connected to the second voltage terminal;
    a gate and a first electrode of the fourteenth transistor are connected to the first voltage terminal;
    a first electrode of the fifteenth transistor is connected to the first output terminal, and a second electrode thereof is connected to the second voltage terminal.

4. The logic unit circuit according to claim 3, the logic unit circuit further comprises a sixteenth transistor and a seventeenth transistor, wherein
    a gate and a first electrode of the sixteenth transistor are connected to the first voltage terminal, and a second electrode thereof is connected to a second output terminal;
    a gate of the seventeenth transistor is connected to the first output terminal, a first electrode thereof is connected to the second output terminal, and a second electrode thereof is connected to the second voltage terminal.

5. The logic unit circuit according to claim 1, the logic unit circuit further comprises a twelfth transistor, whose gate and first electrode are connected to the first voltage terminal, and second electrode is connected to the first electrode of the second transistor and the first electrode of the sixth transistor.

6. The logic unit circuit according to claim 5, the logic unit circuit further comprises a thirteenth transistor, a fourteenth transistor, and a fifteenth transistor, wherein
    a gate of the thirteenth transistor is connected to the second electrode of the first transistor, the second electrode of the second transistor, the second electrode of the fifth transistor, and the second electrode of the sixth transistor, a first electrode thereof is connected to a second electrode of the fourteenth transistor and a gate of the fifteenth transistor, and a second electrode thereof is connected to the second voltage terminal;
    a gate and a first electrode of the fourteenth transistor are connected to the first voltage terminal;
    a first electrode of the fifteenth transistor is connected to the first output terminal, and a second electrode thereof is connected to the second voltage terminal.

7. The logic unit circuit according to claim 6, the logic unit circuit further comprises a sixteenth transistor and a seventeenth transistor, wherein a gate and a first electrode of the sixteenth transistor are connected to the first voltage terminal, and a second electrode thereof is connected to a second output terminal;
a gate of the seventeenth transistor is connected to the first output terminal, a first electrode thereof is connected to the second output terminal, and a second electrode thereof is connected to the second voltage terminal.

8. The logic unit circuit according to claim 1, the logic unit circuit further comprises a first capacitor, whose one terminal is connected to the gate of the ninth transistor, and another terminal is connected to the first output terminal.

9. The logic unit circuit according to claim 8, the logic unit circuit further comprises a thirteenth transistor, a fourteenth transistor, and a fifteenth transistor, wherein
a gate of the thirteenth transistor is connected to the second electrode of the first transistor, the second electrode of the second transistor, the second electrode of the fifth transistor, and the second electrode of the sixth transistor, a first electrode thereof is connected to a second electrode of the fourteenth transistor and a gate of the fifteenth transistor, and a second electrode thereof is connected to the second voltage terminal;
a gate and a first electrode of the fourteenth transistor are connected to the first voltage terminal;
a first electrode of the fifteenth transistor is connected to the first output terminal, and a second electrode thereof is connected to the second voltage terminal.

10. The logic unit circuit according to claim 9, the logic unit circuit further comprises a sixteenth transistor and a seventeenth transistor, wherein
a gate and a first electrode of the sixteenth transistor are connected to the first voltage terminal, and a second electrode thereof is connected to a second output terminal;
a gate of the seventeenth transistor is connected to the first output terminal, a first electrode thereof is connected to the second output terminal, and a second electrode thereof is connected to the second voltage terminal.

11. The logic unit circuit according to claim 1, the logic unit circuit further comprises a second capacitor, whose one terminal is connected to the gate of the tenth transistor, and another terminal is connected to the first output terminal.

12. The logic unit circuit according to claim 11, the logic unit circuit further comprises a thirteenth transistor, a fourteenth transistor, and a fifteenth transistor, wherein
a gate of the thirteenth transistor is connected to the second electrode of the first transistor, the second electrode of the second transistor, the second electrode of the fifth transistor, and the second electrode of the sixth transistor, a first electrode thereof is connected to a second electrode of the fourteenth transistor and a gate of the fifteenth transistor, and a second electrode thereof is connected to the second voltage terminal;
a gate and a first electrode of the fourteenth transistor are connected to the first voltage terminal;
a first electrode of the fifteenth transistor is connected to the first output terminal, and a second electrode thereof is connected to the second voltage terminal.

13. The logic unit circuit according to claim 12, the logic unit circuit further comprises a sixteenth transistor and a seventeenth transistor, wherein
a gate and a first electrode of the sixteenth transistor are connected to the first voltage terminal, and a second electrode thereof is connected to a second output terminal;
a gate of the seventeenth transistor is connected to the first output terminal, a first electrode thereof is connected to the second output terminal, and a second electrode thereof is connected to the second voltage terminal.

14. The logic unit circuit according to claim 1, the logic unit circuit further comprises a thirteenth transistor, a fourteenth transistor, and a fifteenth transistor, wherein
a gate of the thirteenth transistor is connected to the second electrode of the first transistor, the second electrode of the second transistor, the second electrode of the fifth transistor, and the second electrode of the sixth transistor, a first electrode thereof is connected to a second electrode of the fourteenth transistor and a gate of the fifteenth transistor, and a second electrode thereof is connected to the second voltage terminal;
a gate and a first electrode of the fourteenth transistor are connected to the first voltage terminal;
a first electrode of the fifteenth transistor is connected to the first output terminal, and a second electrode thereof is connected to the second voltage terminal.

15. The logic unit circuit according to claim 14, the logic unit circuit further comprises a sixteenth transistor and a seventeenth transistor, wherein
a gate and a first electrode of the sixteenth transistor are connected to the first voltage terminal, and a second electrode thereof is connected to a second output terminal;
a gate of the seventeenth transistor is connected to the first output terminal, a first electrode thereof is connected to the second output terminal, and a second electrode thereof is connected to the second voltage terminal.

16. The logic unit circuit according to claim 14, wherein transistors in the logic unit circuit are all P type transistors, a third voltage is inputted to the first voltage terminal, a fourth voltage is inputted to the second voltage terminal, a first signal is inputted to the first input terminal, a second signal is inputted to the second input terminal, and a signal obtained by performing exclusive-NOR on the first signal and second signal is outputted from the first output terminal, the fourth voltage being greater than the third voltage.

17. The logic unit circuit according to claim 1, wherein transistors in the logic unit circuit are all N type transistors, a first voltage is inputted to the first voltage terminal, a second voltage is inputted to the second voltage terminal, a first signal is inputted to the first input terminal, a second signal is inputted to the second input terminal, and a signal obtained by performing exclusive-OR on the first signal and the second signal is outputted from the first output terminal, the first voltage being greater than the second voltage.

* * * * *